US011456339B2

(12) United States Patent
Huang

(10) Patent No.: US 11,456,339 B2
(45) Date of Patent: Sep. 27, 2022

(54) DISPLAY PANEL AND DISPLAY DEVICE

(71) Applicant: HKC CORPORATION LIMITED, Shenzhen (CN)

(72) Inventor: Beizhou Huang, Shenzhen (CN)

(73) Assignee: HKC CORPORATION LIMITED, Shenzhen (CN)

(*) Notice: Subject to any disclaimer, the term of this patent is extended or adjusted under 35 U.S.C. 154(b) by 0 days.

(21) Appl. No.: 17/413,528

(22) PCT Filed: Dec. 4, 2019

(86) PCT No.: PCT/CN2019/122987
§ 371 (c)(1),
(2) Date: Jun. 11, 2021

(87) PCT Pub. No.: WO2020/125415
PCT Pub. Date: Jun. 25, 2020

(65) Prior Publication Data

US 2022/0028939 A1 Jan. 27, 2022

(30) Foreign Application Priority Data

Dec. 17, 2018 (CN) ........................ 201811542973.2

(51) Int. Cl.

| | |
|---|---|
| ***H01L 27/32*** | (2006.01) |
| ***G09G 3/3266*** | (2016.01) |
| ***G09G 3/3275*** | (2016.01) |

(52) U.S. Cl.
CPC ....... *H01L 27/3223* (2013.01); *G09G 3/3266* (2013.01); *G09G 3/3275* (2013.01); *H01L 27/322* (2013.01); *H01L 27/3276* (2013.01)

(58) Field of Classification Search
CPC ............... H01L 27/3222; H01L 27/322; H01L 27/3276; G09G 3/3266; G09G 3/3275
See application file for complete search history.

(56) References Cited

U.S. PATENT DOCUMENTS

2015/0131025 A1* 5/2015 Ota .................. G02F 1/133512 349/110
2015/0187821 A1* 7/2015 Kim .................. H01L 27/1262 257/390

(Continued)

FOREIGN PATENT DOCUMENTS

CN 20080024337 A 3/2008
CN 102654674 A 9/2012

(Continued)

OTHER PUBLICATIONS

Qing Sang, the International Searching Authority written comments, dated Mar. 2020, CN.

(Continued)

*Primary Examiner* — Patrick N Edouard
*Assistant Examiner* — Eboni N Giles

(57) ABSTRACT

This application discloses a display panel (100) and a display device (600). The display panel (100) includes: a plurality of scan lines (111); a plurality of data lines (112); a color filter (400) formed in a display area (110); and a dummy color filter (410) formed in a non-display area (113). The dummy color filter (410) includes a first dummy color filter (411) and a second dummy color filter (412). The first dummy color filter (411) is located on a first side edge (120) of the non-display area (110) and is arranged perpendicular to the scan lines (111). The first dummy color filter (411) has openings.

19 Claims, 6 Drawing Sheets

410
400
301
302
R
G
B
R
G
B
200

(56) References Cited

U.S. PATENT DOCUMENTS

2017/0038636 A1* 2/2017 Yu ..................... G02F 1/13394
2018/0024399 A1* 1/2018 Han ................. G02F 1/133536
349/43
2018/0321536 A1* 11/2018 Hu .................. G02F 1/133514
2019/0101673 A1* 4/2019 Yao ................. G02F 1/133374
2020/0142249 A1* 5/2020 Kawahira ............ G02F 1/1343
2021/0231846 A1* 7/2021 Wu ...................... G02B 5/201

FOREIGN PATENT DOCUMENTS

CN 106444131 A 2/2017
CN 107329313 A 11/2017
CN 108933475 A 12/2018
CN 109491164 A 3/2019

OTHER PUBLICATIONS

Qing Sang, the International Searching Report, dated Mar. 2020, CN.

* cited by examiner

DISPLAY PANEL AND DISPLAY DEVICE

CROSS REFERENCE OF RELATED APPLICATIONS

This application claims the priority to the Chinese Patent Application No. CN201811542973.2, filed with National Intellectual Property Administration, PRC on Monday, Dec. 17, 2018 and entitled "DISPLAY PANEL AND DISPLAY DEVICE", which is incorporated herein by reference in its entirety.

TECHNICAL FIELD

This application relates to the technical field of display, and in particular, to a display panel and a display device.

BACKGROUND

The statements herein only provide background information related to this application, and do not necessarily constitute the prior art.

With the development and progress of science and technology, panel displays become mainstream products of displays and are widely used due to a thin body, power-saving, and low radiation, etc. The panel display includes a display panel. A dummy color filter is added to the display panel to protect a filter in a display area to prevent display quality from being affected as a result of an uneven thickness of outermost color resistance.

The dummy color filter affects diffusion of a polyimide (PI) liquid, causing PI backflow.

SUMMARY

This application provides a display panel and a display device, which do not affect diffusion of a PI liquid.

This application discloses a display panel, including: a plurality of scan lines; a plurality of data lines arranged perpendicular to the scan lines; a color filter formed in a display area of the display panel; and a dummy color filter formed in a non-display area of the display panel. A height of the dummy color filter is greater than a height of the color filter. The dummy color filter includes a first dummy color filter and a second dummy color filter. The non-display area includes a first side edge and a second side edge. The first dummy color filter is located on the first side edge and is arranged perpendicular to the scan lines. The second dummy color filter is located on the second side edge and is arranged perpendicular to the data line. The first dummy color filter has openings.

This application further discloses a display panel, including: a plurality of scan lines; a plurality of data lines arranged perpendicular to the scan lines; a color filter formed in a display area of the display panel; and a dummy color filter formed in a non-display area of the display panel. A height of the dummy color filter is greater than a height of the color filter. The dummy color filter includes a first dummy color filter and a second dummy color filter. The non-display area includes a first side edge and a second side edge. The first dummy color filter is located on the first side edge and is arranged perpendicular to the scan lines. The second dummy color filter is located on the second side edge and is arranged perpendicular to the data line. The first dummy color filter has at least two openings. Each of the openings is located between two adjacent scan lines. A spacing between the openings is equal to a spacing between two adjacent scan lines. A spacing between two adjacent openings is equal to the spacing between the two adjacent scan lines.

This application further discloses a display device, including a display panel and a driving circuit. The driving circuit outputs a driving signal to the display panel, and the display panel includes: a plurality of scan lines; a plurality of data lines arranged perpendicular to the scan lines; a color filter formed in a display area of the display panel; and a dummy color filter formed in a non-display area of the display panel. A height of the dummy color filter is greater than a height of the color filter. The dummy color filter includes a first dummy color filter and a second dummy color filter. The non-display area includes a first side edge and a second side edge. The first dummy color filter is located on the first side edge and is arranged perpendicular to the scan lines. The second dummy color filter is located on the second side edge and is arranged perpendicular to the data line. The first dummy color filter has openings.

Compared with a solution in which no opening is added to the dummy color filter, in this application, an opening is provided on the first dummy color filter along the scan line in the display area to ensure smooth discharge of PI in the display area without PI backflow, improving display quality of the display panel.

DETAILED DESCRIPTION OF EMBODIMENTS

It should be understood that, the terms used herein, specific structures, and functional details disclosed herein are intended to describe specific embodiments and merely representative. However, this application may be specifically implemented in many alternative forms, and should not be construed as being limited to the embodiments set forth herein.

In the descriptions of this application, the terms such as "first" and "second" are used only for the purpose of description, and should not be understood as indicating or implying the relative importance or implicitly specifying the number of the indicated technical features. Therefore, unless otherwise stated, a feature defined to be "first" or "second" may explicitly or implicitly include one or more features. "A plurality of" refers to two or more. The terms "include", "comprise" and any variant thereof are intended to cover non-exclusive inclusion. One or more other features, integers, steps, operations, elements, components, and/or a combination thereof may be present or added.

In addition, orientation or position relationships indicated by the terms such as "center", "transverse". "on", "below", "left", "right", "vertical", "horizontal", "top", "bottom", "inside", and "outside" are based on orientation or position relationships shown in the accompanying drawings, and are used only for ease and brevity of illustration and description, rather than indicating that the mentioned apparatus or component must have a particular orientation or must be constructed and operated in a particular orientation. Therefore, such terms should not be construed as limiting of this application.

In addition, unless otherwise clearly specified and defined, terms such as "installation", "interconnection", and "connection" shall be understood in a broad sense, for example, may be a fixing connection, a detachable connection, an integral connection, a mechanical connection, an electrical connection, a direct connection, an indirect connection by using an intermediate medium, or communication between interiors of two components. A person of ordinary skill in the art may understand specific meanings of the terms in this application according to specific situations.

This application is further described below with reference to the accompanying drawings and optional embodiments.

Figure 1:
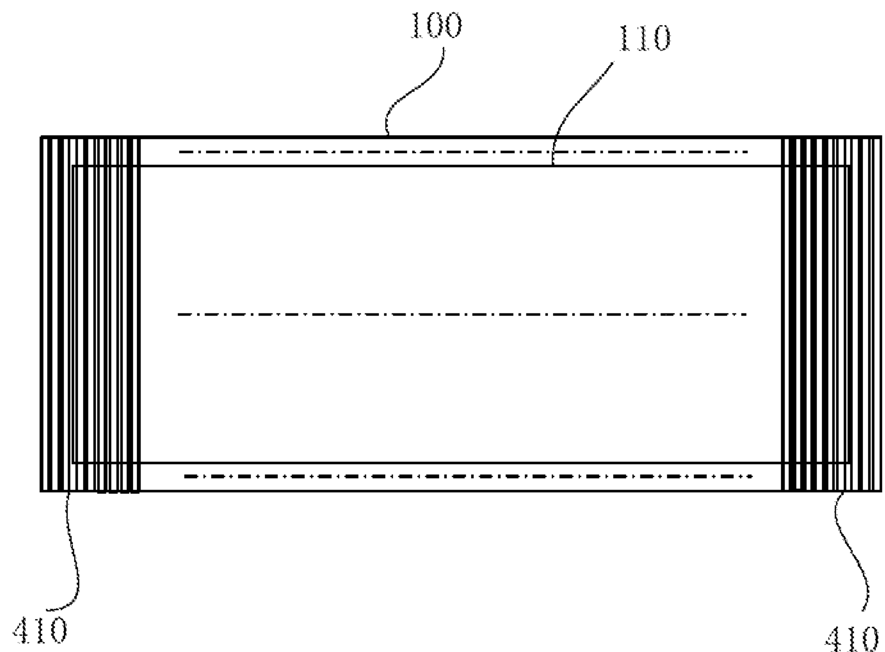
FIG. 1 is a schematic diagram of a display panel according to an embodiment of this application.

FIG. 1 is a schematic diagram of an overall structure of an exemplary display panel 100, which simply illustrates a position of a dummy color filter 410 in the display panel 100.

Figure 2:
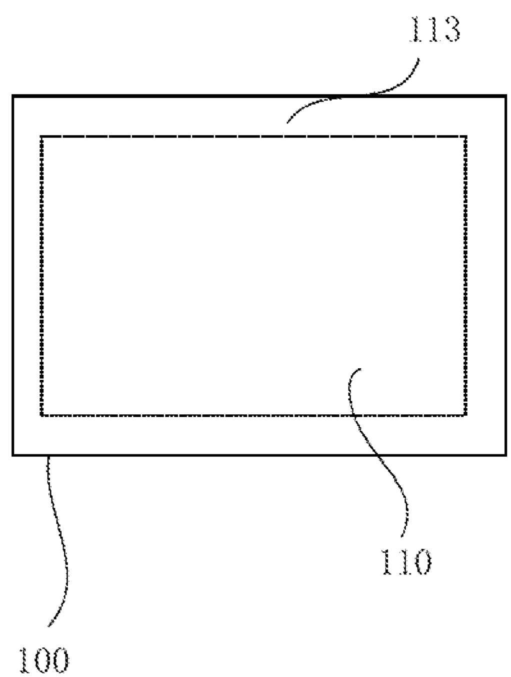
FIG. 2 is a schematic diagram of a display area and a non-display area of a display panel according to an embodiment of this application.
Figure 3:
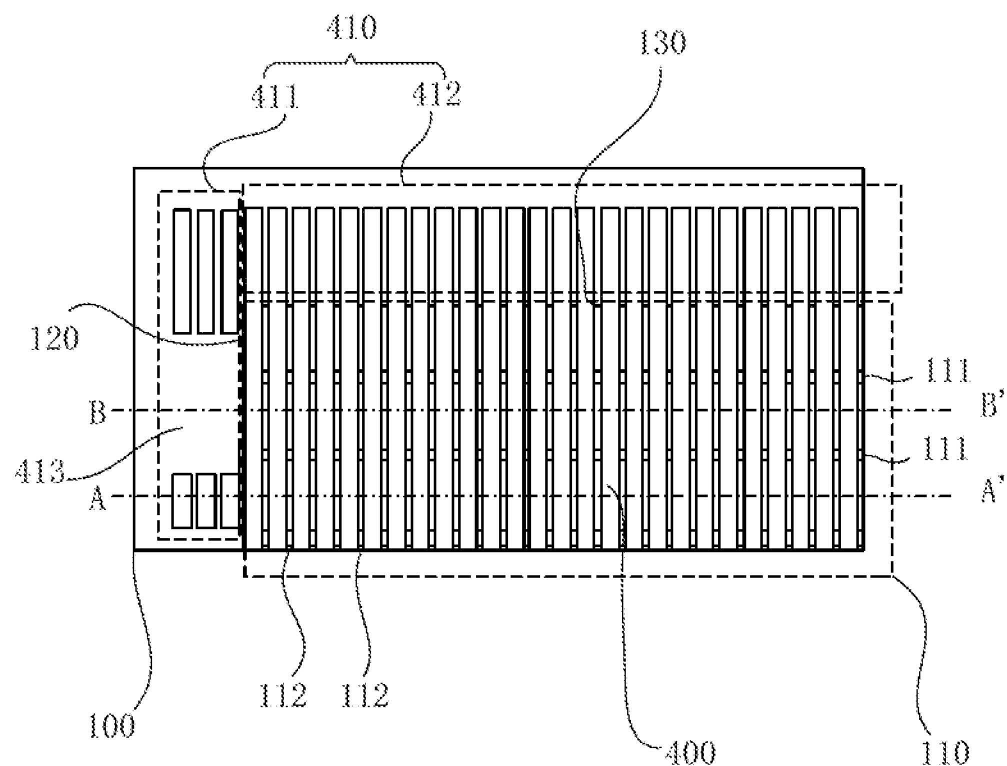
FIG. 3 is a schematic diagram of a display panel according to an embodiment of this application.

As shown in FIG. 2 and FIG. 3, an embodiment of this application discloses a display panel 100. The display panel includes a plurality of scan lines 111, a plurality of data lines 112 perpendicular to the scan lines 111, a color filter 400 formed in a display area 110 of the display panel 100, and a dummy color filter 410 formed in a non-display area 113 of the display panel 100. A height of the dummy color filter 410 is greater than a height of the color filter 400.

The dummy color filter 410 includes a first dummy color filter 411 and a second dummy color filter 412. The non-display area 113 includes a first side edge 120 and a second side edge 130. The first dummy color filter 411 is located on the first side edge 120 of the non-display area 113 and is arranged perpendicular to the scan lines 111. The second dummy color filter 412 is located on the second side edge 130 of the non-display area 113 and is arranged perpendicular to the data line 112. The first dummy color filter 411 has openings 413.

The display panel 100 includes a plurality of color (Red Green Blue, RGB) filters 400. Each of the color filters 400 includes a plurality of red sub-filters, green sub-filters, and blue sub-filters. The color filter 400 is located in the display area 110 of the display panel 100. A periphery of the display area 110 corresponding to the color filter consists of dummy color (dummy RGB) filters 410. The dummy color filters 410 protect the periphery of the color filter 400 from being damaged. Without the dummy color filters 410, color resistance of the color filter 400 has an uneven thickness, affecting display quality. The dummy color filter 410 is located above a light shielding layer, and has an overall height greater than that of the color filter 400 in the display area 110. If the first dunny color filter 410 is not processed, during application of a polyimide (PI) liquid, PI backflow occurs along the scan line 111 in the display area 110, forming a PI backflow area. In a direction perpendicular to the scan lines, no backflow occurs due to presence of a trench. The PI backflow results in whitening around the display area, affecting the display quality. In this application, an opening is provided on the first dummy color filter 411 along the scan line 111 in the display area 110 to ensure smooth discharge of PI in the display area without PI backflow, improving the display quality of the display panel 100.

Figure 4:
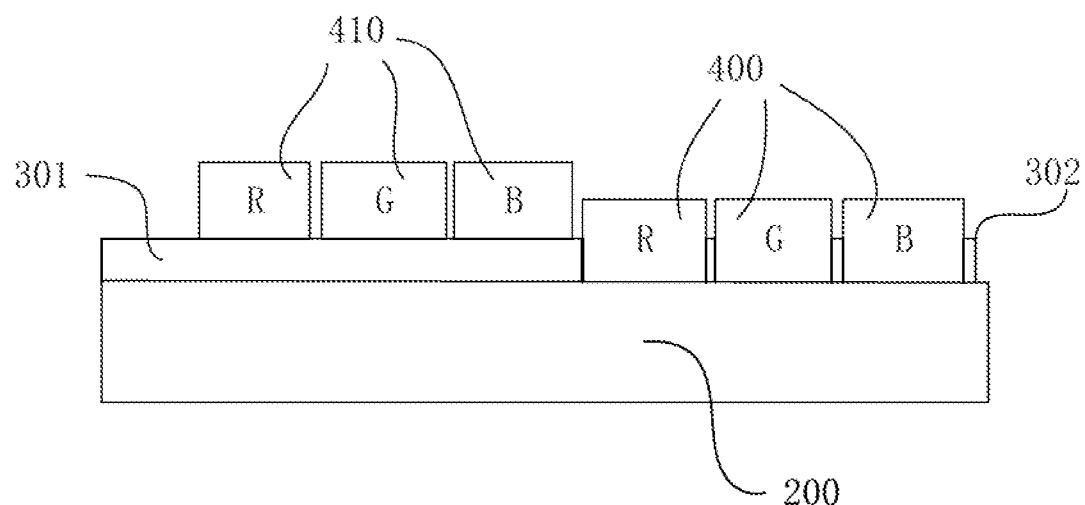
FIG. 4 is a schematic diagram of a cross section of a display panel at A-A' according to an embodiment of this application.

FIG. 4 is a schematic sectional view of FIG. 3 along A-A'. The display panel includes a substrate 200, black matrices 302, and a light shielding layer 301. The black matrices 302 and the light shielding layer 301 are formed on the substrate 200. The black matrices 302 and the light shielding layer 301 are made of the same material. The black matrices 302 are located in the display area. The light shielding layer 301 is located in the non-display area. The dummy color filter 410 is formed on the light shielding layer 301, and the color filter 400 is formed between the black matrices 302.

Figure 5:
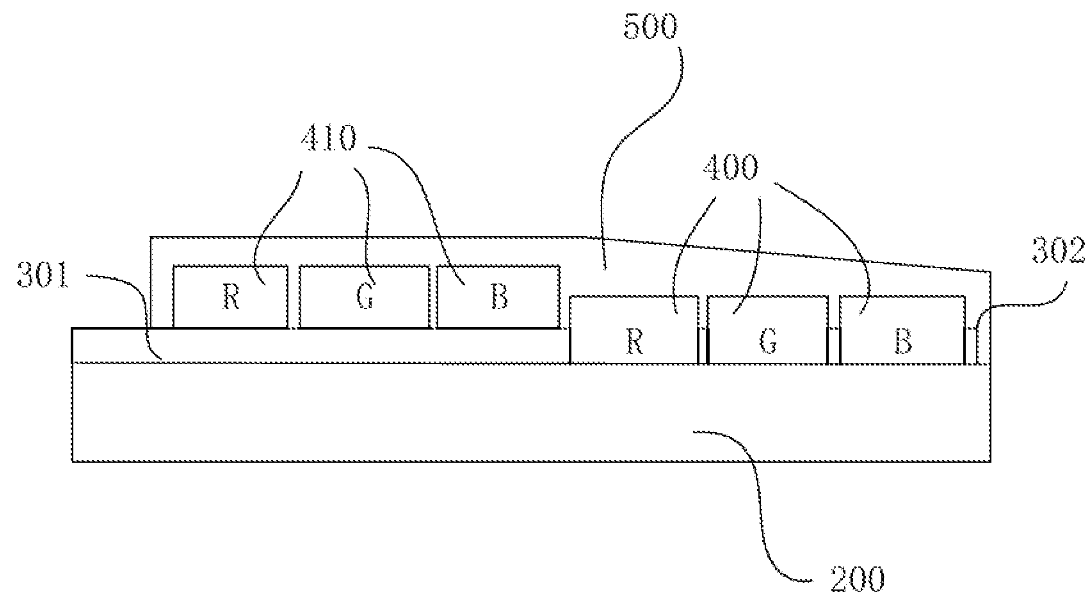
FIG. 5 is a schematic diagram of PI backflow at a cross section of the display panel at A-A' according to embodiment of this application.

FIG. 5 is also a schematic sectional view of FIG. 3 along A-A'. FIG. 5 illustrates a PI backflow area 500 formed during application of a PI alignment liquid. The dummy color filter 410 is designed to protect the color filter 400 at a periphery of the display area 110. The dummy color filter 410 is designed above the light shielding layer 301. A light-transmitting area formed by the light shielding layer 301 of the display area 110 and the color filter 400 are designed in an alternating manner. When a height of the color filter 400 is equal to a height of the dummy color filter 410, since the dummy color filter 410 is disposed above the light shielding layer 301, the height of the dummy color filter needs to be greater than the height of the color filter 400. During application of the PI alignment liquid, backflow of the PI alignment liquid is caused as a result of blocking by the dummy color filter 410.

Figure 6:
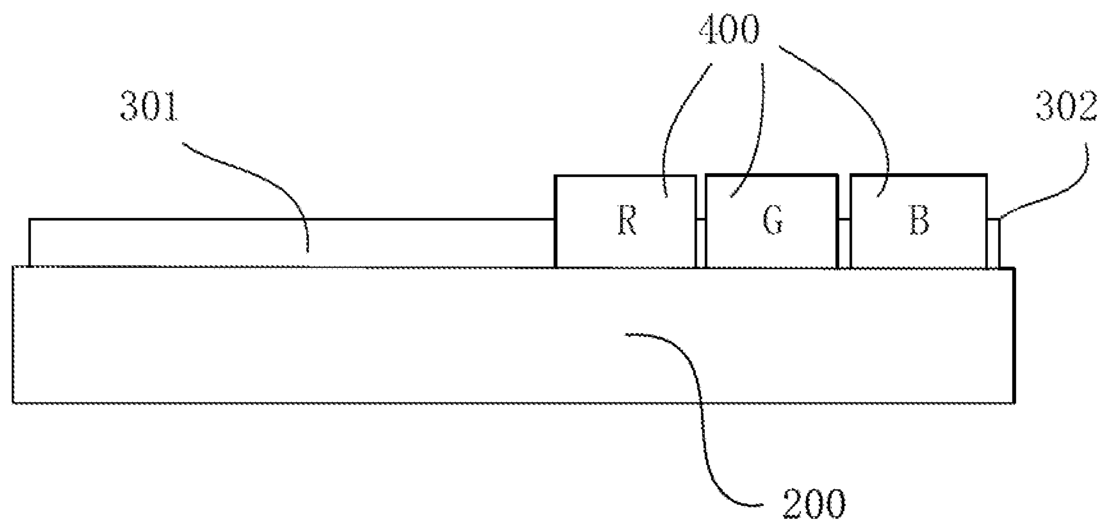
FIG. 6 is a schematic diagram of a cross section of an opening of a display panel at B-B' according to an embodiment of this application.

FIG. 6 is a schematic sectional view of FIG. 3 along B-B'. The dummy color filter above the light shielding layer 301 in the non-display area is removed to form an opening. Due to presence of the opening, the PI alignment liquid can flow out from the opening without causing backflow.

Figure 7:
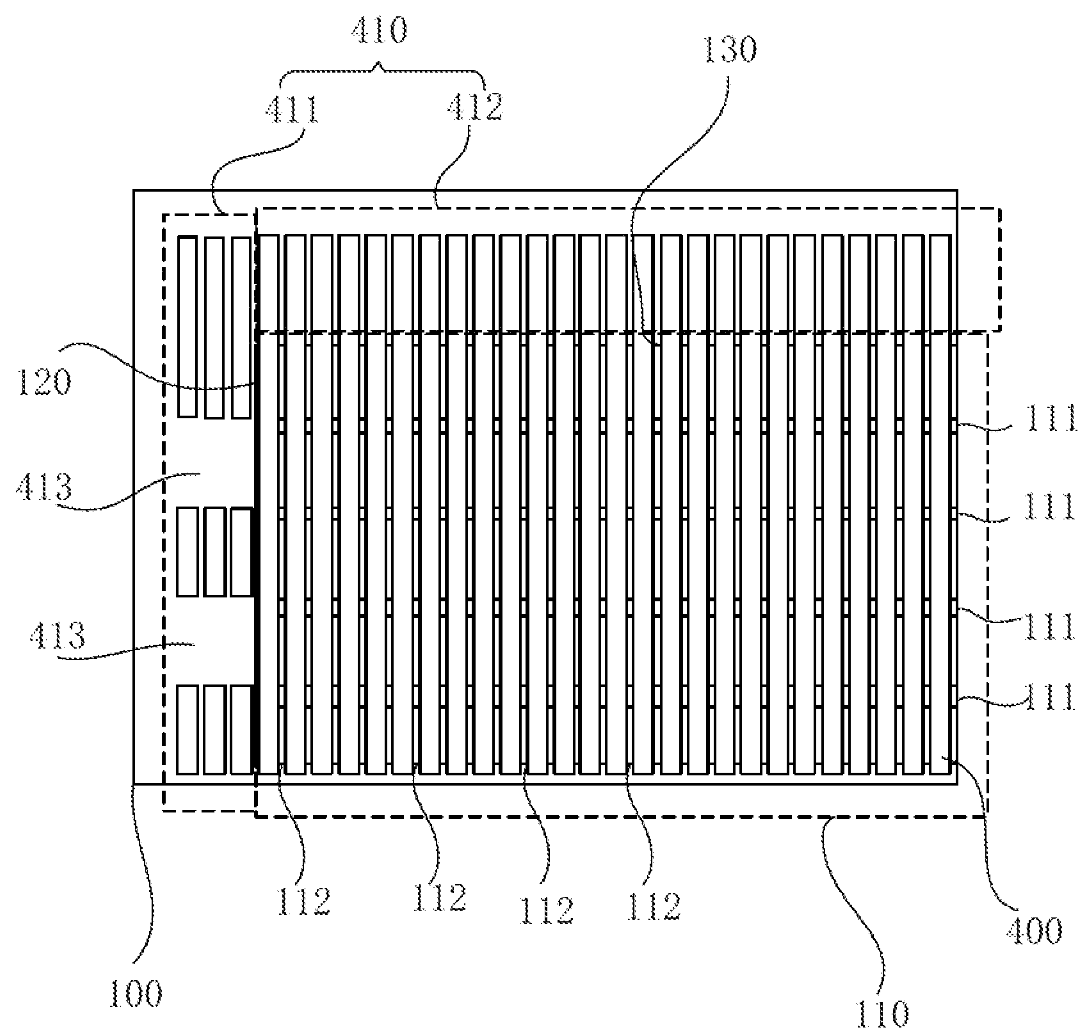
FIG. 7 is a schematic diagram of a display panel according to an embodiment of this application.
Figure 8:
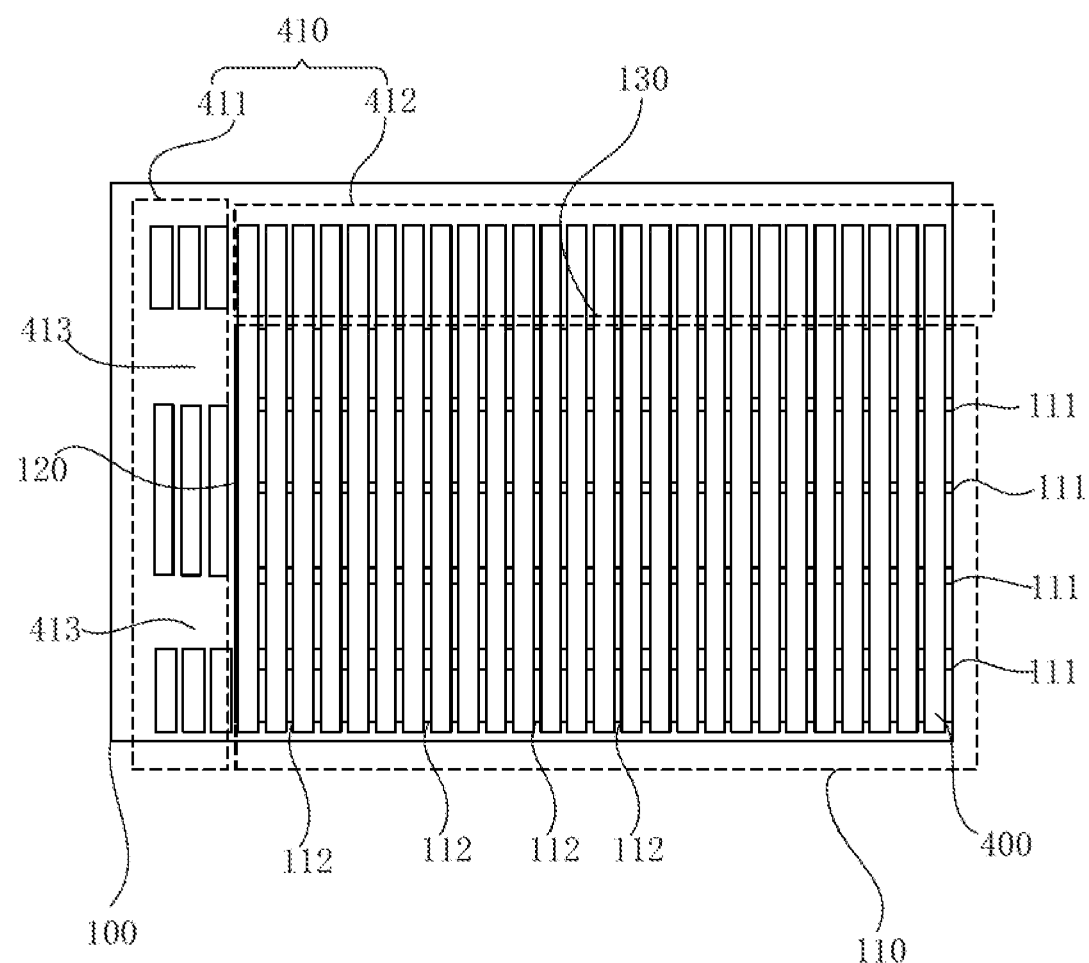
FIG. 8 is a schematic diagram of a display panel with an alternative opening according to another embodiment of this application.
Figure 9:
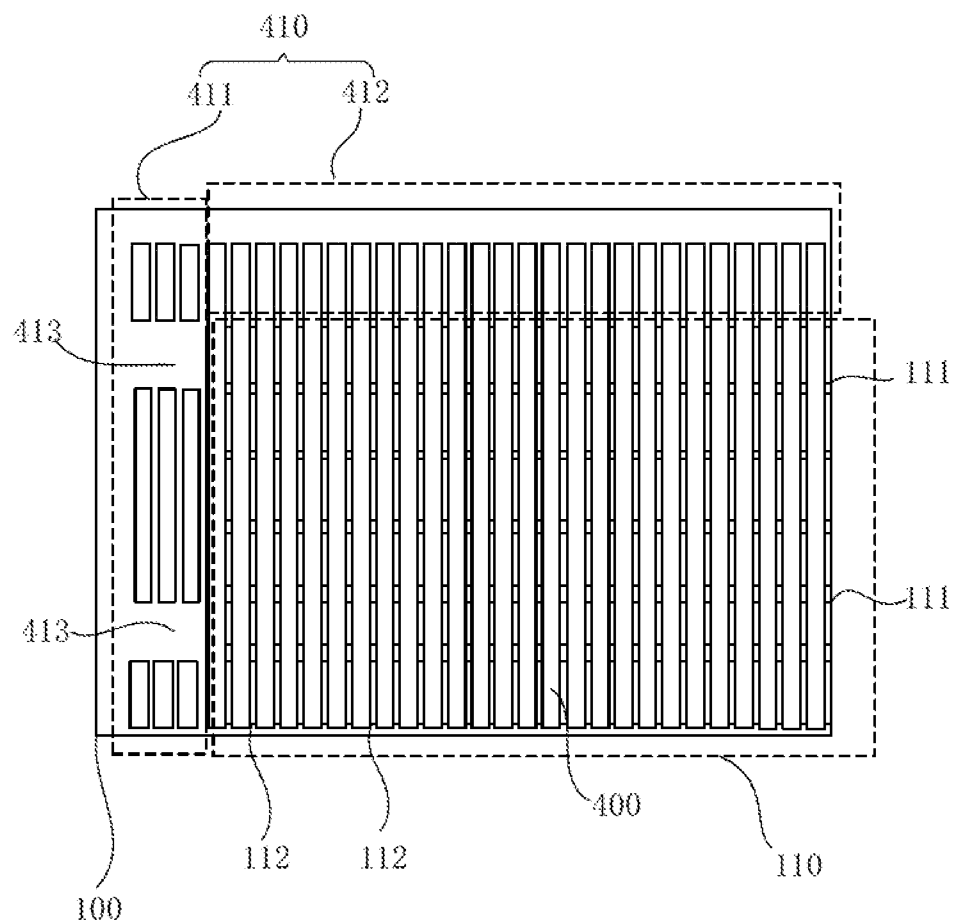
FIG. 9 is a schematic diagram of a display panel with an alternative opening according to another embodiment of this application.

In one or more embodiments, as shown in FIG. 7, FIG. 8, and FIG. 9, a difference from the foregoing embodiment is that each of the openings 413 is located between two adjacent scan lines 111. The opening 413 of the first dummy color filter 411 is located between the two adjacent scan lines 111. Such a design facilitates operations of staffs. In addition, the PI liquid is diffused along the scan line 111, facilitating the diffusion of the PI liquid and avoiding PI backflow.

In one or more embodiments, a spacing between the openings 413 is equal to a spacing between the two adjacent scan lines 111. A length of the opening 413 is consistent with the spacing between the two adjacent scan lines 111, which ensures the diffusion of the PI, maximizes the spacing between the openings 413, and accelerates the diffusion of the PI. If a size of the display panel 100 is relatively small, the spacing between the openings 413 may be correspondingly reduced to one-half of the spacing between the two adjacent scan lines 111. In this way, a diffusion speed of the PI liquid is accordingly controlled, so that the PI liquid is evenly applied in the display area 110. If the size of the display panel 100 is relatively large, the spacing between the openings may be further increased to a spacing across three adjacent scan lines 111. The increase of the opening not only facilitates rapid application of the PI liquid but also avoids backflow more effectively. Certainly, the size of the opening 413 is not limited to the above, and may be designed as required.

In one or more embodiments, the openings include at least two openings 413. A spacing between two adjacent openings 413 is equal to the spacing between the two adjacent scan lines 111 (as shown in FIG. 7). More specifically, the opening 413 is located between an odd-numbered scan line 111 and a next scan line 111. In this case, positions of the openings 413 are directly at four corners of the display area 110. The corners suffer from severe PI backflow as a result of the geographical positions. Therefore, disposing the openings 413 at the corners can avoid backflow more effectively. Certainly, the opening 413 may also be located between an even-numbered scan line 111 and a next scan line 111.

Certainly, the spacing between the openings may also be other sizes, for example, one-half of the spacing between the two adjacent scan lines, or a spacing across three, five, or more adjacent scan lines.

This application provides a method for designing an opening 413. The spacing between the adjacent openings 413 is still equal to the spacing between the scan lines 111. If a first dummy color filter 411 corresponding to a scan line 111 in a current row has the opening 413, a first dummy color filter 411 corresponding to a scan line 11I in a next row does not have the opening 413, and so on. If the first dummy color filter 411 corresponding to the scan line 111 in the current row does not have the opening 413, the first dummy color filter 411 corresponding to the scan line 111 in the next row has the opening 413, so that it can be ensured that the openings 413 of the first dummy color filters 411 corresponding to the adjacent scan lines 111 have different states. Such a design can maximize a number of openings 413, ensure rapid diffusion of the PI liquid, and avoid backflow of the PI liquid.

As shown in FIG. 8, in one or more embodiments, the spacing between two adjacent openings 413 is equal to the spacing across three adjacent scan lines 411.

As another alternative design of the opening 413, the spacing between the two adjacent openings 413 is increased so that the spacing between the two openings 413 is equal to the spacing across the three scan lines 111. A ratio of a length of the opening 413 to a length of a non-opening distance is 1:2. The openings 413 are separated to accelerate the diffusion of the PI liquid in the display panel 100.

As shown in FIG. 9, the arrangement mode of the opening is not limited to the above. As another alternative design of the opening 413, the spacing between two adjacent openings 413 is equal to a spacing across four adjacent scan lines 111. The spacing between the two adjacent openings 413 is increased, so that the spacing between the two openings 413 is equal to the spacing across the four scan lines 111. A ratio of a length of the opening 413 to a length of a non-opening distance is 1:3. The openings 413 are separated to accelerate the diffusion of the PI liquid in the display panel 100.

As still another alternative design of the opening 413, the spacing between two adjacent openings 413 is equal to a spacing across five adjacent scan lines 111. The spacing between the two adjacent openings is increased, so that the spacing between the two openings 413 is equal to the spacing across the three scan lines 111. A ratio of a length of the opening 413 to a length of a non-opening distance is 1:4. The openings 413 are separated.

As shown in FIG. 2 and FIG. 7, another embodiment of this application discloses a display panel 100 including a plurality of scan lines 111, a plurality of data lines 112 perpendicular to the scan lines 111, an color filter 400 formed in a display area 110 of the display panel 100, and a dummy color filter 410 formed in a non-display area 113 of the display panel 100. A height of the dummy color filter 410 is greater than a height of the color filter 400.

The dummy color filter 410 includes a first dummy color filter 411 and a second dummy color filter 412. The non-display area 113 includes a first side edge 120 and a second side edge 130. The first dummy color filter 411 is located on the first side edge 120 of the non-display area 113 and is arranged perpendicular to the scan lines 111. The second dummy color filter 412 is located on the second side edge 130 of the non-display area 113 and is arranged perpendicular to the data line 112. The first dummy color filter 411 has at least two openings 413. Each of the openings 413 is located between two adjacent scan lines 111. A spacing between the openings 413 is equal to a spacing between the two adjacent scan lines 111. A spacing between two adjacent openings 413 is equal to the spacing between the two adjacent scan lines 111.

The color filter 400 is located in the display area 110 of the display panel 100. A periphery of the display area 110 corresponding to the color filter consists of dummy color (dummy RGB) filters 410. The dummy color filters 410 protect the periphery of the color filter 400 from being damaged. Without the dummy color filters 410, color resistance of the color filter 400 has an uneven thickness, affecting display quality. The dummy color filter 410 is located above the light shielding layer 301, and has an overall height greater than that of the color filter 400 in the display area 110. If the first dummy color filter 411 is not processed, during application of a polyimide (PI) liquid, PI backflow occurs along the scan lines 111 in the display area 110. In a direction perpendicular to the scan lines 111, no backflow occurs due to presence of a trench. The PI backflow results in whitening around the display area 110, affecting the display quality. In this application, the first dummy color filter 411 has at least two openings along the scan line 111 of the display area 110, and the opening 413 of the first dummy color filter 411 is located between the two adjacent scan lines 111. Such a design facilitates operations of staffs. In addition, the PI liquid is diffused along the scan line, facilitating the diffusion of the PI liquid. Moreover, a length of the opening 413 is consistent with the spacing between the two adjacent scan lines 111, ensuring the diffusion of the PI and maximizing the spacing of the added opening 413. This application provides a specific opening design, in which a spacing between adjacent openings 413 is equal to a spacing between scan lines 111. If a first dummy color filter 411 corresponding to a scan line 111 in a current row has the opening 413, a first dummy color filter 411 corresponding to a scan line 111 in a next row does not have the opening 413, and so on. If the first dummy color filter 411 corresponding to the scan line 111 in the current row does not have the opening 413, the first dummy color filter 411 corresponding to the scan line 111 in the next row has the opening 413, so that it can be ensured that the openings 413 of the first dummy color filters 411 corresponding to the adjacent scan lines 111 have different states. Such a design can maximize a number of openings 413, ensure rapid diffusion of the PI liquid, and avoid backflow of the PI liquid, thereby improving display quality of the display panel 100.

Figure 10:
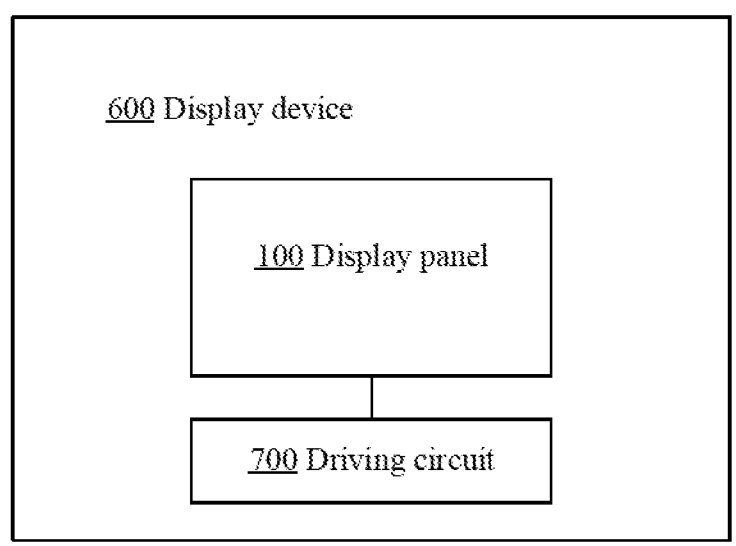
FIG. 10 is a schematic diagram of a display device according to another embodiment of this application.

As shown in FIG. 10, another embodiment of the present application discloses a display device 600, which includes any of the above display panels 100 and a driving circuit 700. The driving circuit 700 outputs a driving signal to the display panel 100.

The technical solutions of this application can be widely used in various display panels, such as a twisted nematic (TN) display panel, an in-plane switching (IPS) display panel, a multi-domain vertical alignment (VA) display panel, or other types of display panels such as an organic light-emitting diode (OLED) display panel, all of which are applicable to the above solutions.

The foregoing contents are detailed descriptions of this application in conjunction with specific optional embodiments, and it should not be considered that the specific implementation of this application is limited to these descriptions. Persons of ordinary skill in the art can further make simple deductions or replacements without departing from the concept of the present application, and such deductions or replacements should all be considered as falling within the protection scope of the present application.

What is claimed is:

1. A display panel, comprising:
- a plurality of scan lines;
- a plurality of data lines arranged perpendicular to the scan lines;
- a color filter formed in a display area of the display panel; and
- a dummy color filter formed in a non-display area of the display panel, wherein a height of the dummy color filter is greater than a height of the color filter; wherein
- the dummy color filter comprises a first dummy color filter and a second dummy color filter, the non-display area comprises a first side edge and a second side edge, the first dummy color filter is located on the first side edge perpendicular to the scan lines, the second dummy color filter is located on the second side edge perpendicular to the data lines, and the first dummy color filter has openings;
- wherein the first dummy color filter disposed on the first side edge comprises a plurality of vertical color filter columns arranged in parallel with the plurality of data lines and at intervals;
- wherein each of the plurality of vertical color filter columns is continuous except for the portions corresponding to the openings; wherein each of the openings spans a width of each of the plurality of vertical color filters, and each of the openings is devoid of color filter columns; wherein each of the openings is located between two adjacent scan lines and has a width measured along a vertical orientation of the display panel that is equal to the distance between the two adjacent scan lines;
- wherein each of the openings is configured to facilitate diffusion of a polyimide (PI) liquid and prevent backflow of the PI liquid during a manufacturing process of the display panel.

2. The display panel according to claim 1, wherein a spacing between the openings is equal to a spacing between two adjacent scan lines.

3. The display panel according to claim 1, wherein a spacing between the openings is ½ a spacing between two adjacent scan lines.

4. The display panel according to claim 1, wherein a spacing between the openings is equal to a spacing across three adjacent scan lines.

5. The display panel according to claim 1, wherein the openings comprise at least two openings.

6. The display panel according to claim 5, wherein a spacing between two adjacent openings is equal to a spacing between two adjacent scan lines.

7. The display panel according to claim 1, wherein the opening is located between each odd-numbered scan line and a next scan line.

8. The display panel according to claim 1, wherein the opening is located between each even-numbered scan line and a next scan line.

9. The display panel according to claim 5, wherein a spacing between two adjacent openings is equal to a spacing across three adjacent scan lines.

10. The display panel according to claim 5, wherein a spacing between two adjacent openings is equal to a spacing across four adjacent scan lines.

11. The display panel according to claim 5, wherein a spacing between two adjacent openings is equal to a spacing across five adjacent scan lines.

12. The display panel according to claim 1, wherein the display panel comprises a color filter substrate, black matrices, and a light shielding layer, wherein the black matrices and the light shielding layer are formed on the color filter substrate, the black matrices and the light shielding layer are made of the same material, the black matrices are located in the display area, the light shielding layer is located in the non-display area, the dummy color filter is formed on the light shielding layer, and the color filter is formed between the black matrices.

13. A display panel, comprising:
- a plurality of scan lines;
- a plurality of data lines arranged perpendicular to the scan lines;
- a color filter formed in a display area of the display panel; and
- a dummy color filter formed in a non-display area of the display panel, wherein a height of the dummy color filter is greater than a height of the color filter; wherein
- the dummy color filter comprises a first dummy color filter and a second dummy color filter, the non-display area comprises a first side edge and a second side edge, the first dummy color filter is located on the first side edge perpendicular to the scan lines, the second dummy color filter is located on the second side edge perpendicular to the data lines, and the first dummy color filter has at least two openings, wherein each of the openings is located between two adjacent scan lines, a spacing between two adjacent openings is equal to the spacing between the two adjacent scan lines;
- wherein the first dummy color filter disposed on the first side edge comprises a plurality of vertical color filter columns arranged in parallel with the plurality of data lines and at intervals;
- wherein each of plurality of the vertical color filter columns is continuous except for the portions corresponding to the openings; wherein each of the openings spans each of the plurality of vertical color filters, and each of the openings is devoid of color filter columns; wherein each of the openings is located between two adjacent scan lines and has a width measured along a vertical orientation of the display panel that is equal to the distance between the two adjacent scan lines;
- wherein each of the openings is configured to facilitate diffusion of a polyimide (PI) liquid and prevent backflow of the PI liquid during a manufacturing process of the display panel.

14. A display device, comprising a display panel and a driving circuit, wherein the driving circuit is configured to output a driving signal to the display panel, and wherein the display panel comprises:
- a plurality of scan lines;

a plurality of data lines arranged perpendicular to the scan lines;

a color filter formed in a display area of the display panel; and a dummy color filter formed in a non-display area of the display panel, wherein a height of the dummy color filter is greater than a height of the color filter; wherein the dummy color filter comprises a first dummy color filter and a second dummy color filter, the non-display area comprises a first side edge and a second side edge, the first dummy color filter is located on the first side edge perpendicular to the scan lines, the second dummy color filter is located on the second side edge perpendicular to the data lines, and the first dummy color filter has openings;

wherein the first dummy color filter disposed on the first side edge comprises a plurality of vertical color filter columns arranged in parallel with the plurality of data lines and at intervals;

wherein each of the plurality of the vertical color filter columns is continuous except for the portions corresponding to the openings; wherein each of the openings spans each of the plurality of vertical color filters, and each of the openings is devoid of color filter columns;

wherein each of the openings is configured to facilitate diffusion of a polyimide (PI) liquid and prevent backflow of the PI liquid during a manufacturing process of the display panel.

15. The display device according to claim 14, wherein each of the openings is located between two adjacent scan lines, and a spacing between the openings is equal to a spacing between two adjacent scan lines.

16. The display device according to claim 15, wherein the openings comprise at least two openings, and a spacing between two adjacent openings is equal to the spacing between the two adjacent scan lines.

17. The display panel according to claim 1, wherein each of the openings of comprises an upper edge and a lower edge that are in parallel with the scan lines.

18. The display panel according to claim 1, wherein the plurality of vertical color filter columns are arranged at regular intervals; wherein the color filter formed in the display area of the display panel comprises a plurality of vertical color filter columns arranged in parallel with the plurality of data lines and at regular intervals; wherein an interval between every two adjacent vertical color filter columns of the first dummy color filter is equal to an interval between every two adjacent vertical color filter columns of the color filter disposed in the display area of the display panel.

19. The display panel according to claim 1, wherein the openings are disposed at regular intervals along a vertical direction of the display panel in parallel with the data lines.

* * * * *